United States Patent
Travis

(10) Patent No.: US 10,897,233 B2
(45) Date of Patent: Jan. 19, 2021

(54) SWITCHING AMPLIFIERS AND POWER CONVERTERS

(71) Applicant: Google LLC, Mountain View, CA (US)

(72) Inventor: Chris Travis, Gloucestershire (GB)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/999,312

(22) PCT Filed: Feb. 15, 2017

(86) PCT No.: PCT/GB2017/050390
§ 371 (c)(1),
(2) Date: Aug. 16, 2018

(87) PCT Pub. No.: WO2017/141025
PCT Pub. Date: Aug. 24, 2017

(65) Prior Publication Data
US 2019/0044488 A1 Feb. 7, 2019

(30) Foreign Application Priority Data
Feb. 16, 2016 (GB) .................................. 1602724.5

(51) Int. Cl.
H03F 3/217 (2006.01)
H02M 3/158 (2006.01)
H03F 1/02 (2006.01)

(52) U.S. Cl.
CPC ........ *H03F 3/2178* (2013.01); *H02M 3/1582* (2013.01); *H03F 1/0238* (2013.01); *H03F 3/2171* (2013.01); *H03F 3/2173* (2013.01)

(58) Field of Classification Search
CPC .... H03F 3/2178; H03F 1/0238; H03F 3/2173; H03F 3/2171; H03F 2200/351; H03F 3/217; H02M 3/1582
(Continued)

(56) References Cited

U.S. PATENT DOCUMENTS

| 4,186,437 A | 1/1980 | Cuk |
| 5,442,317 A | 8/1995 | Stengel |

(Continued)

FOREIGN PATENT DOCUMENTS

| GB | 2376357 | 12/2002 |

OTHER PUBLICATIONS

'cognipower.com' [online] "CogniPower predictive energy balancing for switched mode power amplifiers," Thomas Lawson. Available on or before 2013 [Retrieved on Jan. 28, 2019] Retrieved from Internet: URL< http://cognipower.com/pdf/APEC2013_PEB_Audio_Amp.pdf> 22 pages.
(Continued)

*Primary Examiner* — Khanh V Nguyen
(74) *Attorney, Agent, or Firm* — Fish & Richardson P.C.

(57) ABSTRACT

This invention relates to switching amplifiers and switching power converters with bipolar outputs. A new circuit configuration is disclosed which is neither 'single ended' nor 'bridged'. This introduces a new category of amplifiers and power converters, which are 'spanning'. Also disclosed are new circuit topologies and new switching sequence strategies for such amplifiers and converters. These unlock improvements in power efficiency, space efficiency and cost efficiency. The improvements can be obtained across a wide range of signal amplitudes, with load circuits which may be resistive, partly reactive, or wholly reactive.

22 Claims, 12 Drawing Sheets

(58) Field of Classification Search
USPC .............. 330/10, 207 A, 251, 127, 129, 297
See application file for complete search history.

(56) References Cited

U.S. PATENT DOCUMENTS

| | | | |
|---|---|---|---|
| 5,610,553 A | 3/1997 | Kirn | |
| 5,734,258 A | 3/1998 | Esser | |
| 5,745,351 A | 4/1998 | Taurand | |
| 6,538,505 B1 | 3/2003 | Kirn | |
| 6,636,431 B2 | 10/2003 | Seki et al. | |
| 6,646,507 B1 | 11/2003 | Prokin et al. | |
| 7,786,709 B2* | 8/2010 | Lawson | H02M 1/10 323/206 |
| 8,098,056 B2* | 1/2012 | Yamazaki | H02M 3/157 323/222 |
| 8,410,851 B1 | 4/2013 | Hsieh | |
| 8,680,795 B2* | 3/2014 | Tang | H02M 3/155 318/139 |
| 8,772,984 B2* | 7/2014 | Chang | A63B 21/00178 307/151 |
| 8,786,238 B2* | 7/2014 | Oyobe | H02P 3/22 307/10.1 |
| 9,853,538 B2* | 12/2017 | Adest | H02J 1/102 |
| 9,859,801 B2* | 1/2018 | Wangemann | H02M 3/1582 |
| 10,090,709 B2* | 10/2018 | Matsumoto | H02J 7/00 |
| 2002/0125941 A1 | 9/2002 | Nguyen | |
| 2005/0030768 A1 | 2/2005 | Mamillan | |
| 2015/0035360 A1* | 2/2015 | Marbach | H02J 7/0052 307/23 |

OTHER PUBLICATIONS

Boeke et al. "Experimental analysis of a flyback converter with excellent efficiency," IEEE APEC Conference proceedings, Mar. 19, 2006, 7 pages.

Branca et al. "Proposal of a low power, 1.6MHz, 91% efficiency, single inductor, double symmetrical outputs integrated DC-DC converter for CCM and DCM operation," IEEE ECCE Conference Proceedings, Sep. 2011, 5 pages.

Burrow et al. "Efficient of low power audio amplifiers and loudspeakers," IEEE Transactions on Consumer Electronics, 2001, 11 pages.

Caceres et al. "A boost DC-AC converter: Operation, analysis, control and experimentation," IEEE IECON Conference Proceedings, Nov. 1995, 6 pages.

Carbone. [Book] "Chapter 9," Energy Storage in the Emerging Era of Smart Grids, ISBN 9789533072692, Sep. 2011, 28 pages.

Caricchi et al. "20 kW water-cooled prototype of a buck-boost bidirectional DC-DC converter topology for electrical vehicle motor drives," IEEE APEC Conference Proceedings, Mar. 1995, 6 pages.

Chen et al. "Buck-Boost PWM converters having two independently controlled switches," IEEE PESC Conference Proceedings, 2001, 6 pages.

Erickson et al."Chapter 6," Fundamentals of Power Electronics, Second Edition, Klumar Academic Publishers, eBook ISBN 0-306-48048-4, 2004, 72 pages (Coverpages, Table of Contents, Preface, Ch. 6).

Honda et al. "Class D Audio Amplifier Basics," International Rectifier Application Note AN-1071, Available on or before Apr. 2, 2016 via the wayback internet archive, [retrieved on Nov. 26, 2018] Retrieved from Internet: URL< https://www.infineon.com/dgdl/an-1071.pdf?fileId=5546d462533600a40153559538eb0ff1 > 14 pages.

Hwu et al. "Output power enhancement of full-bridge class-D amplifier," IEEE IPEC Conference Proceedings, Jun. 2010, 5 pages.

Janocha et al. "New approach to a switching amplifier for piezoelectric actuators," Energy 2, ISBN 978-3-933339-00-1, 1998, 4 pages.

Keele. "Comparison of direct-radiator loudspeaker system nominal power efficiency vs. true efficiency with high-BI drivers," AES Convention Paper 5887, Oct. 2003, 11 pages.

Ki et al. "Single-inductor multiple-output switching converters," IEEE Transactions on Circuits and Systems II, 2001, 6 pages.

Maizonave et al. "Analysis of current-bidirectional buck-boost based switch mode audio amplifier," International Conference on Renewable Energies and Power Quality, Apr. 2011, 6 pages.

PCT International Preliminary Report on Patentability issued in International Application No. PCT/GB2017/050390, dated Feb. 28, 2018, 14 pages.

PCT International Search Report and Written Opinion issued in International Application No. PCT/GB2017/050390, dated Apr. 11, 2017, 16 pages.

Ren et al. "Three-mode dual-frequency two-edge modulation scheme for four-switch buck-boost converter," IEEE Transaction on Power Electronics, Feb. 2009, 11 pages.

Rios et al. "A novel electrical configuration for three wire piezoelectric bimorph micro-positioners," IEEE ASME Conference Proceedings, Jul. 2014, 6 pages.

Tormo et al. "A grounded-output 5-switch bipolar buck-boost converter topology for switching power amplifiers," IEEE ISCAS Proceedings, May 2011, 4 pages.

Venkatesan. "Current mode controlled bidirectional flyback converter," IEEE PESC Convention Proceedings, Jun. 1989, 8 pages.

Walker. "Four quadrant amplifier based on the flyback topology," IEEE APEC Conference Proceedings, Mar. 1995, 5 pages.

Zhang et al. "A high efficiency flyback converter with new active clamp technique," IEEE Transaction on Power Electronics, Jul. 2010, 11 pages.

TW Office Action in Taiwan Appln. No. 106105126, dated Oct. 6, 2020, 16 pages (with English translation).

\* cited by examiner

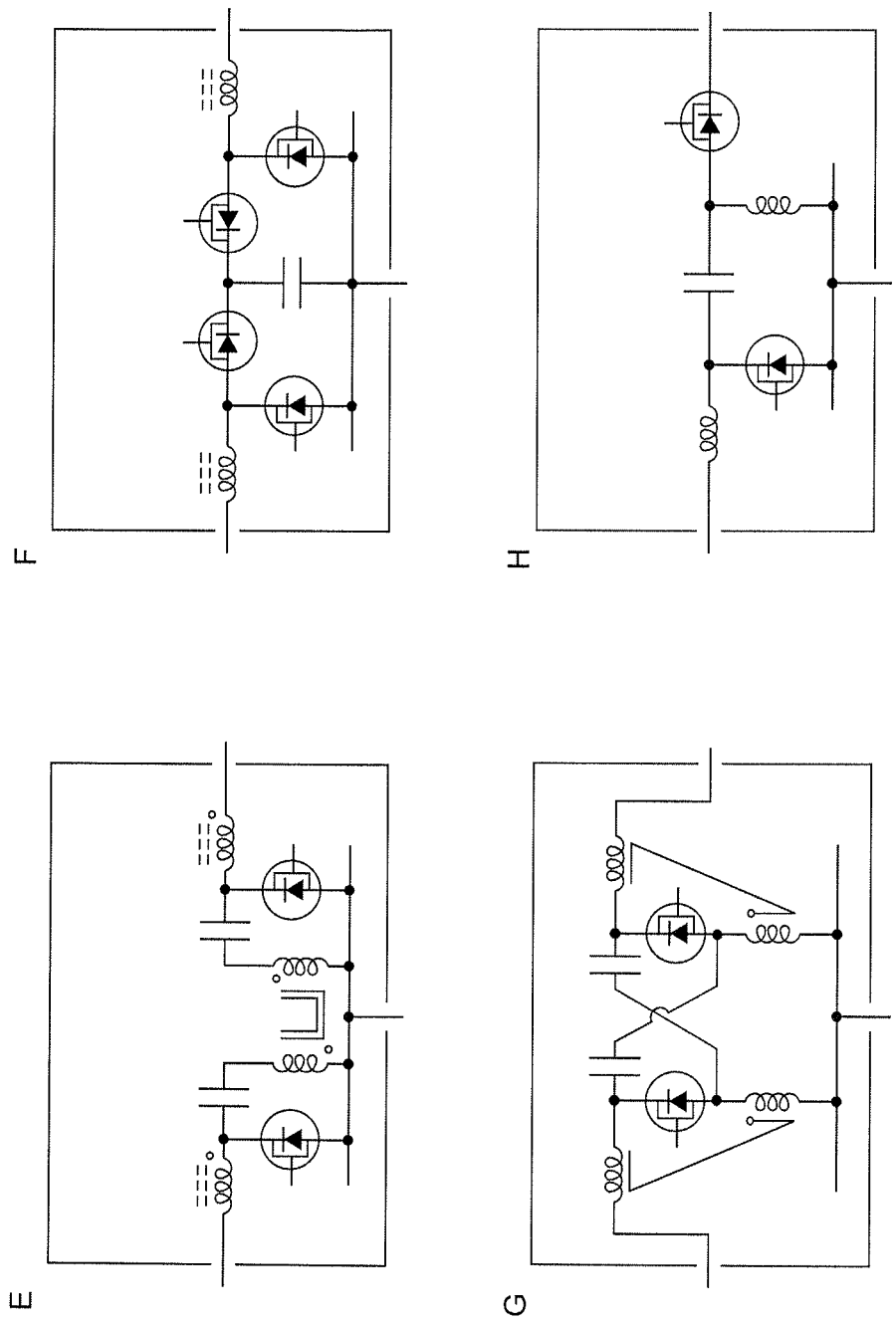
FIG. 17Cont'd

SWITCHING AMPLIFIERS AND POWER CONVERTERS

CROSS-REFERENCE TO RELATED APPLICATIONS

This application is a U.S. National Phase Application under 35 U.S.C. § 371 of International Patent Application No. PCT/GB2017/050390, filed Feb. 15, 2017, which claims priority to GB Patent Application No. 1602724.5, filed Feb. 16, 2016. The entire contents of each of the foregoing applications is hereby incorporated by reference.

FIELD OF THE INVENTION

The invention relates to switching amplifiers and switching power converters with bipolar outputs. In particular, the invention relates to amplifier circuits that are able to provide for power efficiency, space efficiency and cost efficiency over known amplifier circuits.

BACKGROUND TO THE INVENTION

The designers of switching power amplifiers routinely borrow from the world of power conversion. An excellent power conversion reference is the 2004 edition of 'Fundamentals of Power Electronics' by Erickson and Maksimovic (ISBN 0-306-48048-4) hereafter referred to as Erickson & Maksimovic. However, there are significant issues that need to be addressed when designing an amplifier circuit that are not of concern in the power conversion field. Amplifiers typically have to be able to deal with signals that are highly dynamic and bipolar (for example DC-free), whereas most power converters are DC-DC converters with static unipolar outputs. Additionally, waveform fidelity tends to be a much greater concern with amplifiers than with power converters. For example, even small amounts of zero-crossing distortion can be a problem in audio applications. Also, in operation, amplifiers tend to be under-modulated by several orders of magnitude most of the time. In contrast, most power converters spend most of their time near full modulation. A good summary of design issues affecting switching amplifiers is the 2005 application note on 'Class D Audio Amplifier Basics' by Honda and Adams (International Rectifier Application Note AN-1071). It explains common problems such as dead time distortion.

Amplifiers can be connected to a load in a number of known configurations. FIG. 1 shows the single-ended connection of a load 10 to a unidirectional amplifier 12 in accordance with the prior art. As in many applications, only a single power supply rail is available. The output signal seen by the load is made DC-free by including a DC-blocking capacitor 14. This is shown connected to zero volts, but can alternatively be connected to the amplifier's other power-supply terminal, VP. The amplifier 12 has been drawn as a power converter to emphasize the power flow, which is always from the power supply to the load. The input signal and the control circuitry are left un-shown. The amplifier 12 may for example have a class-B output stage (non-switching).

FIG. 2 shows the bridged connection of a load 20 between two amplifier blocks 22, 24. This sidesteps the need for a DC-blocking capacitor. When the amplifier blocks 22, 24 are class-B amplifiers, the differential output voltage range lies between −VP (minus VP) and +VP (plus VP). For example, with VP equal to 10 volts, the range lies between −10 volts and +10 volts. The circuit shown in FIG. 2 cannot boost the output beyond −VP and +VP.

FIG. 3 shows a single-ended switching amplifier that acts as a bidirectional power converter 32. The bidirectional power converter 32 is connected to a load 30. A DC-blocking capacitor 34 is also included. The power converter 32 is typically a buck converter. Such amplifiers can drive loads that are partly or wholly reactive, without consuming a lot of power. Reactive energy from the load, or from the amplifier's output filter, is passed back to the power supply. This energy does then need to be accommodated, or there may be excessive supply voltage pumping, but there are well established solutions for that.

FIG. 4 shows a bridged switching amplifier that uses two bidirectional power converter blocks 42, 44 bridging a load 40. If the power converters are buck converters, this arrangement becomes the classic class-D H-bridge. It is shown, from a power-conversion viewpoint, in FIGS. 6.11 and 6.14.5 of Erickson & Maksimovic. As before, the input signal and the control circuitry are left un-shown. The input signal can take many forms, including analog waveforms and digital number streams. The control scheme can take many forms, including pure feedforward, single-loop voltage feedback, single-loop current feedback, charge control, multi-loop, and hybrid.

The need for power-supply voltage boosting and the need for signal amplification often go hand-in-hand. Various innovators has sought to combine these two functions. For example, U.S. Pat. No. 6,646,507 discloses a 'Power booster amplifier' which intrinsically achieves voltage boosting of up to ×2. And in a 2010 paper on 'Output power enhancement of full-bridge class-D amplifier' (IEEE IPEC conference proceedings) Hwu and Yau present a circuit with voltage boosting of up to ×3. However, the circuits are intricate, and the boosted voltages are present at all times. This gives reduced efficiency during those periods in which voltage boosting is not needed, which is typically most of the time.

An alternative is to use boosted voltages only when the signal is large enough to make it necessary. This is related to the well-known class-G and class-H amplifier topologies. Through the years, many designers have implemented tracking supplies. An excellent example is disclosed in U.S. Pat. No. 5,442,317. As this combines class H and class D, it is sometimes called class HD. Another example is disclosed in U.S. Pat. No. 6,538,505. Selective use of boosted voltages can very much improve the energy efficiencies that are achieved at low signal levels. In applications where the signals tend to have high crest factors, this benefit tends to map directly to increased battery life.

One of the problems with such solutions is their relatively high complexity. For example, class HD circuits generally have at least two largely separate conversion blocks, each with its own wound component. This makes for relatively high cost and size, and low efficiency. An ideal solution would be single-stage and comprise fewer components.

The power conversion literature describes a different way of raising efficiencies at low signal levels, which is to design the converter to use DCM (discontinuous conduction mode). In DCM, each cycle of switching activity is separated from the next by a period of time in which the main switch currents are zero. As the signal level reduces, the fraction of time for which the switch currents are zero increases. This pushes the conduction losses down. The vast majority of switching amplifiers use CCM (continuous conduction mode). However, there is a trend towards increased use of DCM in switching amplifiers.

It would be desirable to find a building block that offers both voltage boosting and bipolar output. If such a topology exists, it could be used to build a simple single-stage boost amplifier that does not need a DC-blocking capacitor. However, FIG. 6.14 in Erickson & Maksimovic shows all of the basic converter topologies, along with their gain curves under PWM (pulse width modulation). Only two of the curves pass through zero, and only one of those has a voltage-boosting aspect. It is the curve for the Watkins-Johnson converter. But this converter can only boost the voltage in one direction, not both. It can drive its output more negative than −VP (minus VP), but not more positive than +VP (plus VP). So there does not appear to be a simple single-stage, bipolar-output boost amplifier topology known in the art.

U.S. Pat. No. 4,186,437 discloses the bridging of two boost-capable blocks to form a boost amplifier. Its boost-capable blocks are Cuk converters (FIG. 6.15.1 in Erickson & Maksimovic). Cuk and Erickson presented a related paper in 1978 titled 'A conceptually new high-frequency switched-mode power amplifier technique eliminates current ripple' (Powercon5 conference proceedings). In it they disclose the possibility of instead using boost converters or inverting buck-boost converters (FIGS. 6.14.2 and 6.14.3 in Erickson & Maksimovic). Caceres and Barbi also present the use of boost converters in their 1995 IEEE paper, 'A boost DC-AC converter: Operation, analysis, control and experimentation' (IEEE IECON conference proceedings). Such solutions are appealing, but they still comprise two largely-separate blocks, each with its own wound component. They are not single-stage designs.

It is also important to consider how amplifiers and converters behave with real-world loads. A useful reference is the 2001 paper on 'Efficiency of low power audio amplifiers and loudspeakers' by Burrow and Grant (IEEE Transactions on Consumer Electronics). The authors make the point that "the ability of the class-D amplifier to recycle quadrature load current offers new ways to improve efficiency". This point is driven home by a 2003 paper from Keele titled 'Comparison of direct-radiator loudspeaker system nominal power efficiency vs. true efficiency with high-BL drivers' (AES Convention Paper 5887). Another important class of loads is piezoelectric. Considerations when driving such loads are set out in Rios and Flemming's 2014 paper on 'A novel electrical configuration for three wire piezoelectric bimorph micro-positioners' (IEEE ASME conference proceedings), which also underlines the value of offset bipolar drive.

For high efficiency and low distortion when driving partly-reactive loads such as loudspeakers, a switching amplifier needs to be bidirectional. More particularly, it needs to be a four-quadrant amplifier, managing seamlessly as the polarities of the load current and load voltage move between (++), (−+), (−−) and (+−). In the (++) and (−−) quadrants the amplifier delivers energy to the load. In the (+−) and (−+) quadrants it recycles energy back from the load. Erickson & Maksimovic does not explicitly teach about four-quadrant conversion, but the topic is covered in chapter 9 of the 2011 book 'Energy Storage in the Emerging Era of Smart Grids', edited by Carbone (ISBN 978 953 307 269 2). FIG. 5 shows the four quadrants, along with two load lines. The diagonal load line 50 is for purely resistive loads. The circular load line 52 is for sine waves into purely-reactive loads. Most loads are neither purely-resistive nor purely reactive, especially when seen through an output filter. The recycling of reactive energy from output filters can be just as important as the recycling of reactive energy from loads.

This recycling of reactive energy happens without the need for special switching strategies when you run a full-bridge class-D amplifier in CCM. It seems that many amplifier designers think the same is true for DCM, but this is not the case. In DCM, a control block selects a switching sequence from a small number of available sequences, once every control cycle. The selection depends in-part on the present state of the circuit. For example, it can depend on the polarities of the load voltage and the load current. If the set of available switching sequences has got blind spots, or if the control block selects inappropriate switching sequences from the set, the circuit will not function as a four-quadrant amplifier. A good example of the approach that has to be taken can be found in a 1995 paper by Walker, titled 'Four quadrant amplifier based on the flyback topology' (IEEE APEC conference proceedings). It describes four different switching sequences, and it sets out the circumstances under which each is used. Like many publications, this paper refers to the different switching sequences as "modes".

There is a further issue that needs to be addressed with four quadrant operation. Some amplifiers have the ability to operate in all four quadrants, but are not seamless between the quadrants. This is shown diagrammatically in FIG. 6. For the controlled handling of reactive loads, an amplifier needs to be able to move seamlessly between the quadrants. For example, it needs to be able to pull high currents from the load, even as the load voltage reduces towards zero (region R in FIG. 6). Walker's circuit, disclosed in 'Four quadrant amplifier based on the flyback topology' (IEEE APEC conference proceedings 1995) has limitations in this regard. In that circuit, as the output voltages approach zero, the duty cycle on the secondary side will become excessively long. Unless measures are taken to prevent it, current conduction will become continuous. This results in crossover distortion.

Another example is the circuit disclosed in U.S. Pat. No. 5,610,553. While its power stage can be operated bidirectionally, its control circuit does not accommodate the switching sequences that would be necessary for such operation. In fact, this amplifier can be abstracted as shown in FIG. 7. Its output is bipolar so the DC-blocking capacitor of FIG. 1 is not required. Similar comments apply to the circuit disclosed in U.S. Pat. No. 8,410,851. This amplifier can be abstracted as shown in FIG. 8. Its output is bipolar and symmetric. It is similar to what could be obtained from a single-ended amplifier plus a transformer. The focus of these and similar circuits is firmly on resistive loads. The opportunities that exist to improve efficiency and fidelity by recycling reactive energy are not explored.

A troublesome feature of the circuits disclosed in U.S. Pat. Nos. 5,610,553 and 8,410,851 is that some of the output voltages necessarily go below zero volts. This makes it difficult or impossible to implement these circuits as semiconductor ICs (integrated circuits). In most IC processes, it is not allowed for any node to go more negative than the substrate.

An attractive feature of the circuits disclosed in U.S. Pat. Nos. 5,610,553 and 8,410,851 is that they use just one wound component; a simple two-terminal inductor. The same is true of various circuits from the DC DC converter world. Some examples can be found in the 2001 paper on 'Single-inductor multiple-output switching converters' by Ki and Ma (IEEE Transactions on Circuits and Systems II). A further example features in the 2011 paper titled 'Proposal of a low power, 1.6 MHz, 91% efficiency, single inductor, double symmetrical outputs integrated DC-DC converter for CCM and DCM operations', by Branca, Chesneau, Allard and Lin-Shi (IEEE ECCE conference proceedings). All these circuits time-slice the use of a single inductor to regulate the voltages on multiple output terminals.

An ambitious broadening and deepening of some of the above-mentioned approaches is disclosed in U.S. Pat. No. 7,786,709. The power stage of the preferred embodiment has six abstracted switches, a first terminal, a second terminal and a shared terminal. Energy flow can be bidirectional, and the circuit can be configured to operate as a boost amplifier. U.S. Pat. No. 7,786,709 also teaches that the power supply can be AC rather than DC.

With bipolar signals, the circuit disclosed in U.S. Pat. No. 7,786,709 suffers from the semiconductor-IC integration problem that of the output voltages necessarily go below zero volts. Furthermore, in real implementations its six abstracted switches become twelve FETs (field-effect transistors), as can be seen in FIG. 8 of U.S. Pat. No. 7,786,709. This doubling up is because the switches need to withstand bipolar voltages, and it has a significant impact on size, cost, and efficiency. Switch implementation is covered in section 4.1.4 of Erickson & Maksimovic, and is further explored in a 2011 paper titled 'A grounded-output 5-switch bipolar buck-boost converter topology for switching power amplifiers', by Tormo, Poveda, Alarcon and Guinjoan (IEEE ISCAS proceedings).

There is a need for new approaches to the design and implementation of switching amplifiers and switching power converters having bipolar outputs. In particular, there is a need to sidestep some or all of the problems of prior approaches. These problems include: a) The presence and impact of dead-time distortion mechanisms; b) Zero crossing distortion arising from transitions between different switching sequences; c) The proliferation of FETs due to the need to withstand bipolar voltages; d) The difficulty of implementing circuits as semiconductor ICs due to substrate voltage issues; e) High losses at low modulation depths due to the use of CCM; f) Unexpected behaviours due to the inability to handle reactive energy from the load; g) The difficulty of designing bidirectional DCM circuits; h) The difficulty of designing bipolar DCM circuits. i) The impact of non-signal-adaptive voltage boosting on efficiency; and j) The impact of signal-adaptive voltage boosting on efficiency and design time due to its complexity.

There is also a need for boost amplifiers and boost power converters which outperform prior solutions across a range of metrics. These metrics include: a) Overall energy efficiency, and hence battery life; b) Worst-case losses, and hence heatsinking requirement; c) Compactness; d) Component cost; e) Assembly cost; f) Level of integration; and e) Reliability.

It is an object of the present invention to address some or all of the problems described above, or at least to provide the public with a useful alternative.

SUMMARY OF THE INVENTION

The invention is defined in the appended independent claims, to which reference should be made.

In a first aspect of the invention, there is provided a switching amplifier or bipolar-output switching power converter comprising:

a power stage comprising a first terminal, a second terminal and a common terminal;

wherein the power stage is configured to operate with a load circuit connected between the first and second terminals.

The amplifier or power converter is configured to span the load circuit. This configuration provides for improvements in power efficiency, space efficiency and cost efficiency over the prior art. The improvements can be obtained across a wide range of signal amplitudes, and with load circuits that may be resistive, partially reactive or wholly reactive.

As a consequence of the spanning configuration, the amplifier or power converter can establish both positive and negative differential voltages at its load. Advantageously, the power stage provides greater than ×2 voltage boosting and signal modulation in a single stage. The overall amplifier then combines voltage boosting and signal modulation in a single stage. This avoids the inefficiencies and costs of solutions that do all of their voltage boosting in a first block, and then modulate the signal onto the boosted voltage in a second block.

Advantageously, the power stage is configured, at some times, to move energy from the first terminal to the second terminal, and at other times, to from the second terminal to the first terminal. Energy can be recovered from the load circuit, providing for power efficiency.

Advantageously, the amplifier is configured to operate in discontinuous conduction mode (DCM). DCM provides high overall efficiency when amplifying signals with high peak-to-average power ratios. DCM also removes dead-time distortion effects that are a problem with conventional class-D amplifiers.

The power stage may comprise a plurality of switches that can be operated to provide both voltage boosting of a voltage from a power supply and signal modulation based on an input signal.

The power stage is advantageously configured to connect to a power supply providing a power supply voltage such that neither the first terminal nor the second terminal is permanently tied to the power supply voltage. Preferably, the first terminal is connected to a first node and the second terminal is connected to a second node, wherein the first node and the second node may be dynamically tied to the power supply voltage. In normal operation either the first node is tied to the power supply voltage, the second node is tied to the power supply voltage or neither the first node nor the second node is tied to the power supply voltage.

To achieve this, a first diode may be connected from the power supply voltage to the first node and a second diode may be connected from the power supply voltage to the second node. The first and second diodes may allow for a flow of current from the power supply to either the first node or the second node, depending on a voltage at the first and second nodes.

The amplifier may further comprise a first reservoir capacitor connected to the first node and a second reservoir capacitor connected to the second node. The amplifier operates to move energy from the reservoir capacitors to the load and from the load to the reservoir capacitors. The first and second reservoir capacitors may be connected to ground.

Alternatively, a first transistor may be connected to the first node and a second transistor connected to the second node, the first and second transistors allowing for a flow of current between the power supply and either the first node or the second node (or neither node). With this arrangement, reservoir capacitors may not be required as energy can be moved from the load back to the power supply. The power supply then acts partly as an energy reservoir.

The power stage is bidirectional in that energy can be moved from the first terminal to the second terminal and from the second terminal to the first terminal. Preferably, the power stage comprises a bidirectional buck-boost converter. However, the power stage may take other forms that provide both voltage boosting and voltage bucking in both directions. The bidirectional power stage may comprise two unidirectional power converters arranged to provide bidirectional power conversion. For example, an arrangement of two interleaved, unidirectional buck-boost circuits may form the power stage. The two unidirectional power converters may be cross-coupled. The two unidirectional power converters may share a common inductor.

The bidirectional buck-boost converter may take a plurality of different forms. In one preferred embodiment the bidirectional buck-boost converter is a bidirectional flyback converter. The bidirectional flyback converter may comprise a coupled inductor and two active switches. The small number of active switches means that losses are relatively small. The active switches may be field effect transistors (FETs). The FETs may be ground-referred, which makes them easy to drive.

The bidirectional buck-boost converter may comprise a plurality of active switches. Preferably, the bidirectional buck-boost converter comprises no more than four active switches. The active switches may comprise transistors. Schottky diodes may be connected across each of the transistors.

The bidirectional buck-boost converter may be a bidirectional four-switch converter. The bidirectional four-switch converter, may advantageously comprise a single, two-terminal inductor.

Alternatively, the bidirectional buck-boost converter may be a three-port converter comprising a further terminal, wherein the further terminal is connected to the power supply voltage. A three port power converter may deliver reduced losses in some circumstances.

Preferably, the bidirectional buck-boost converter comprises a single wound component.

Preferably, the bidirectional buck-boost converter is a non-inverting converter. Preferably, the bidirectional buck-boost converter is configured for four-quadrant operation. Preferably the bidirectional buck-boost converter is configured to provide voltage boosting to greater than twice a supply voltage. This is advantageous in audio applications, with high peak-to-average power ratios.

The amplifier may be provided in an integrated circuit. The amplifier may be controlled so that the voltage at the first terminal and the voltage at the second terminal never drop below a substrate voltage, which is typically zero volts.

The amplifier may further comprise a control circuit for the power stage. The control circuit may be configured to control the power stage based on a voltage across the load circuit or current through the load circuit. The control circuit may operate to control a differential voltage across the load circuit, or may operate to control another parameter, such as a current, an integrated voltage, charge, or some combination of these parameters.

The bidirectional buck-boost converter may comprise a plurality of active switches and the control circuit may be configured to control each of the active switches. In a second aspect of the invention, there is provided a switching amplifier circuit or bipolar-output switching power converter circuit comprising:

an amplifier according to the first aspect of the invention; and a load circuit connected between the first and second terminals. The load circuit typically comprises an output filter and a load.

The load circuit may comprise at least one reactive component, and the control circuit may be configured to operate the power stage to take energy from the load circuit and to subsequently reapply that energy to the load circuit.

The load circuit may take a plurality of different forms. The load circuit may comprise a load alone or a load together with additional components, such as an output filter. The load may comprise, for example, a piezoelectric actuator or a loudspeaker.

The load circuit may comprise a predominantly resistive load and a capacitive output filter. It may additionally comprise an inductive component, for low-pass filtering.

The amplifier circuit may further comprise a power adaptation block and a power reservoir connected to the power supply voltage. This may be used to smooth energy demand from a primary power supply and ease power demand bottlenecks.

As described, the amplifier may be configured such that the first and second terminals are at positive voltage throughout operation. This allows the amplifier circuit to be implemented in an integrated circuit, on a semiconductor chip.

In a third aspect of the invention, there is provided a method of operating a switching amplifier or bipolar-output switching power converter comprising a power stage having a first terminal, a second terminal and a common terminal, the method comprising:

connecting a load circuit between the first terminal and the second terminal.

The method may comprise the step of operating the power stage to move energy from the first terminal to the second terminal, and from the second terminal to the first terminal.

Preferably, the power stage comprises a bidirectional buck-boost converter.

The method may comprise controlling the bidirectional buck-boost converter based on a voltage or current at the first terminal and a voltage or current at the second terminal. The method may comprise operating the bidirectional buck-boost converter in discontinuous conduction mode.

The bidirectional buck-boost converter may be connected to a power supply voltage such that each of the first terminal and the second terminal can be dynamically connected to and disconnected from the power supply voltage.

The load circuit may comprise a reactive component, and the method may further comprise taking energy from the load circuit and subsequently reapplying that energy to the load circuit.

In a further aspect of the invention, there is provided a switching amplifier circuit comprising:

a bidirectional power stage;

a load circuit connected to the bidirectional power stage;

a power supply supplying a power supply voltage to the bidirectional power stage; and at least one energy storage device connected to the bidirectional power stage but not directly connected to the power supply, wherein, in operation, the bidirectional power stage can be controlled to transfer energy from the load to the energy storage device and from the energy storage device to the load.

The bidirectional power stage may comprise a buck-boost converter and is preferably non-inverting. The load circuit is advantageously fully or partially reactive. The load circuit or the load may be connected between the two terminals of the bidirectional power stage. Advantageously, the terminals of the bidirectional power stage are each dynamically connected to the power supply voltage.

The amplifier or power converter is preferably configured to provide voltage boosting and signal modulation in a single stage.

Features described in relation to one aspect of the invention may be applied to other aspects of the invention.

BRIEF DESCRIPTION OF THE DRAWINGS

Embodiments of the Invention will now be described in detail, by way of example only, with reference to the accompanying drawings, in which.

DETAILED DESCRIPTION

Figure 9:
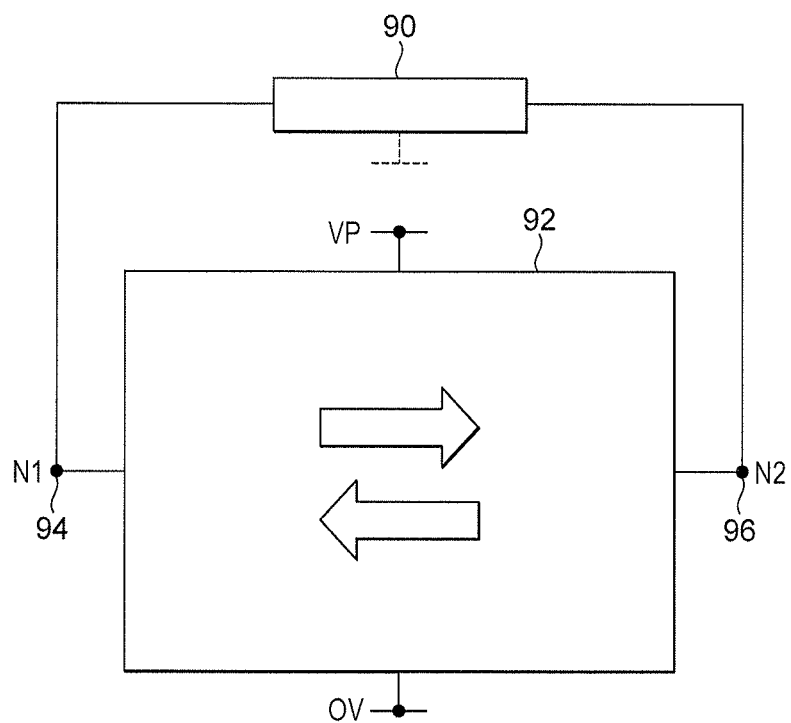
FIG. 9 shows a switching amplifier or power converter according to the invention.

The key connections of an amplifier or power converter according to the present invention are shown in general form in FIG. 9. A power stage 92 is connected to a load circuit 90 comprising a load, via a first node (N1) 94 and a second node (N2) 96. The power stage 92 is also connected to a power supply (not shown) via two or more power supply nodes 97, 98, which in this case have voltages VP and 0V (zero volts). Nodes 94 and 96 are distinct from the power supply nodes 97, 98 in FIG. 9, although as will be described they may at times be dynamically connected. The amplifier establishes a desired signal at the load circuit 90 or at the load by, at some times transferring energy from N1 to N2, and at other times transferring energy from N2 to N1. In both of these directions of energy transfer, the power stage's voltage conversion range includes both step-down (buck) and step-up (boost).

As a consequence of the spanning configuration, the amplifier or power converter can establish both positive and negative differential voltages at the load. It can provide a bipolar output, even though its power stage only has unipolar input/output (IO) at N1 and N2.

As a consequence of the power stage 92 having step-down and step-up capabilities in both directions, the amplifier or power converter can be operated as a four-quadrant device. When operated this way, it can recover inductive energy from the load circuit 90, and it can successfully drive highly reactive loads.

The voltage step-up capability of the power stage 92 preferably extends considerably beyond voltage doubling. This gives the amplifier or power converter an overall voltage-boosting capability. It can establish differential voltages on the load that extend considerably beyond −VP (minus VP) and +VP (plus VP). Furthermore, it can do this without any of its node voltages going below 0V.

Voltage-boosting amplifiers and power converters according to the configuration of FIG. 9 combine their voltage boosting and signal modulation in a single power stage. They avoid the inefficiencies and costs of solutions that do all of their voltage boosting in a first block, and then modulate the signal onto the boosted voltage in a second block.

Within the power stage, the energy path between N1 and N2 is preferably a direct path, meaning that it involves just one stage or conversion rather than a cascade of multiple stages or conversions. And the energy transfers are preferably direct transfers, preferably involving just one wound component.

The power supply may be a single-rail DC supply (unipolar), or it can instead be multi-rail or AC (bipolar). The power supply and the power stage 92 have node 0V as a common node in FIG. 9, though they can instead be electrically isolated. VP may be a static voltage, or it may instead be time-varying or parameter-dependent. In general, power can flow not just from the power supply, but also back to it.

Figure 10:
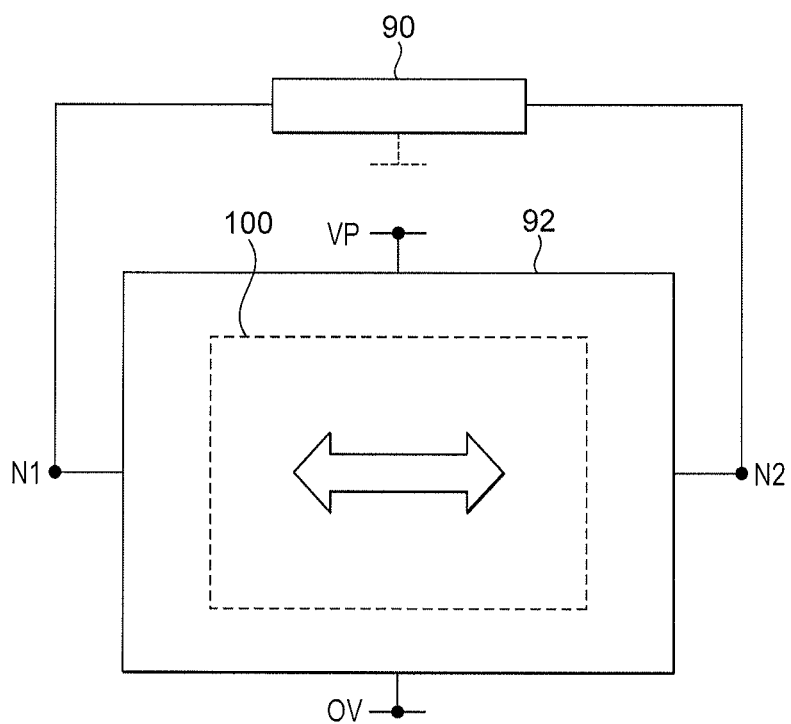
FIG. 10 shows the circuit of FIG. 9 incorporating a bidirectional buck-boost converter.

As shown in FIG. 10, one way of implementing an amplifier or power converter according to the present invention is to build its power stage 92 around a non-inverting bidirectional buck-boost converter 100. The term bidirectional buck-boost converter is used herein to mean a bidirectional converter whose conversion range includes both voltage step-down and voltage step-up, in both directions of energy transfer. Bidirectional buck-boost converters are well-known in the art. However, they are generally used as two-port devices with their power sources and destinations connected to one port or the other port. This can be seen in U.S. Pat. No. 7,786,709, for example. In the amplifiers and power converters of the present invention, the load is instead connected across the bidirectional buck-boost converter.

Bidirectional buck-boost converters typically have unipolar input/outputs (IOs). They are sometimes called bidirectional buck-boost DC-DC converters. The term DC-DC relates to the unipolarity of the IOs. It does not mean that the IO voltages have to be static.

Figure 6:
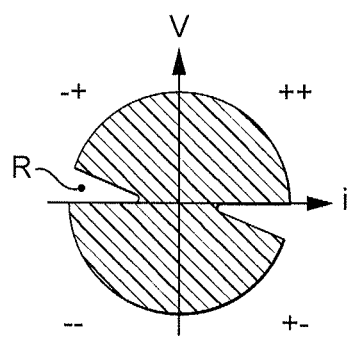
FIG. 6 depicts the achievable operating area of one particular prior-art amplifier.
Figure 7:
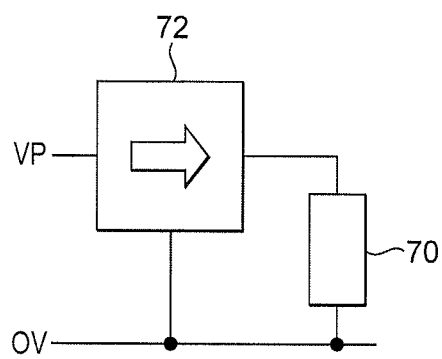
FIG. 7 depicts a prior-art amplifier with bipolar output and grounded load.
Figure 8:
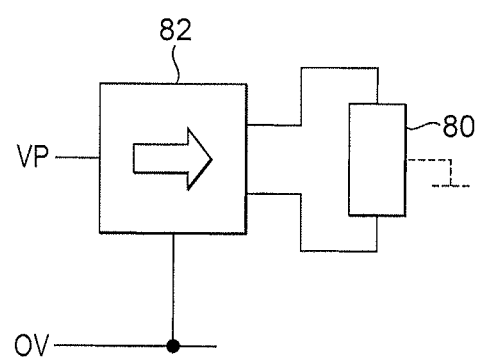
FIG. 8 depicts a prior-art amplifier with bipolar output and floating load.

Bidirectional buck-boost converters can generally move seamlessly from voltage step-down, through the 1:1 ratio, to voltage step-up. In other words, the 1:1 ratio is somewhere in the middle of their voltage conversion range, not at one of the ends. In the arrangement shown in FIG. 10, the 1:1 ratio corresponds to zero differential voltage at the load. Seamless operation in this area ameliorates zero-crossing distortion, and avoids the four-quadrant problems described earlier with reference to FIG. 6.

Figure 11:
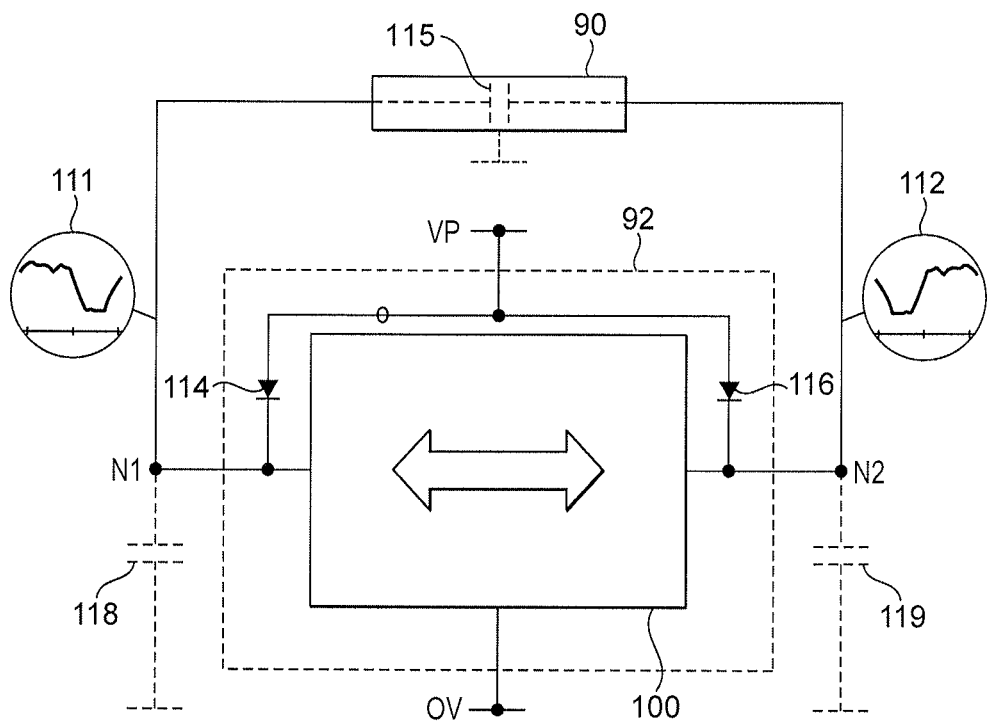
FIG. 11 shows a diode-based power injection arrangement for the circuit of FIG. 10.
Figure 12:
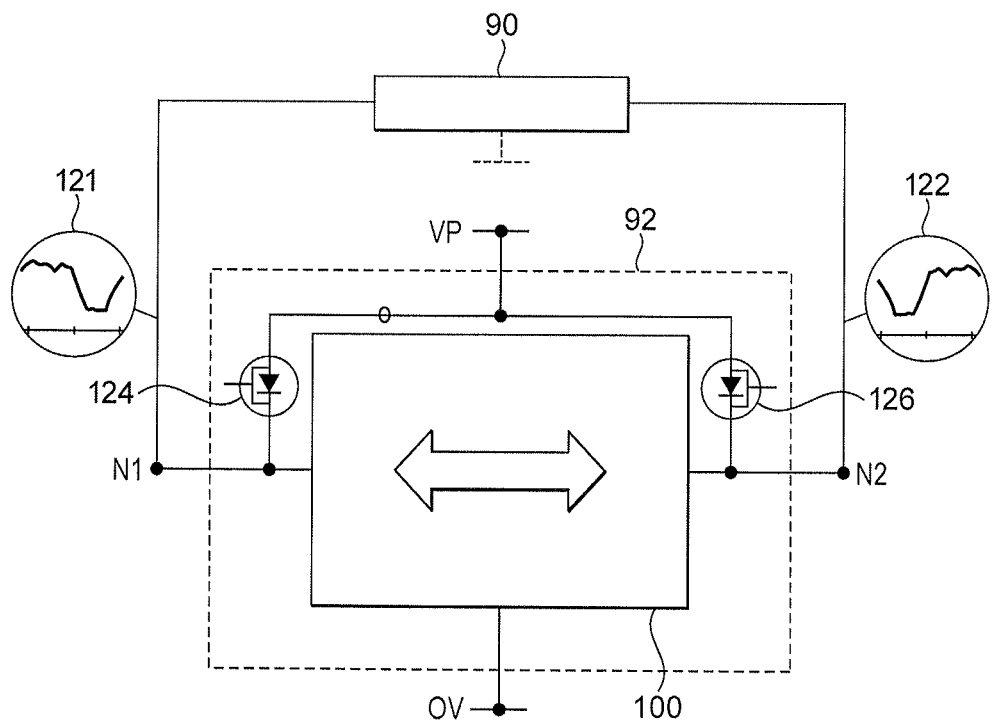
FIG. 12 shows a FET-based dynamic power supply voltage pinning arrangement for the circuit of FIG. 10.

The transfer of energy between N1 and N2 is important. However, getting power from the power supply, and sometimes back to the power supply, is also important. Multiple arrangements are possible for this. FIG. 11 and FIG. 12 show two of them.

In FIG. 11 the heart of the power stage 92 is a bidirectional buck-boost converter 100, as already described with reference to FIG. 10. Its two IO terminals are connected to nodes N1 and N2 respectively, and its common terminal is connected to 0V. Four-terminal isolated bidirectional buck-boost converters can also be used, by first commoning a terminal from one side with a terminal from the other side. This action un-isolates the converter and creates a common terminal. The arrangement of FIG. 11 additionally has two diodes 114, 116 via which power can flow from the power supply VP. They are typically Schottky diodes. Diode 114 is connected from VP to N1, and diode 116 is connected from VP to N2.

Operation is best understood by considering the case that the load circuit 90 is a simple two-terminal capacitive load 115. In this case the arrangement also needs a first reservoir capacitor 118 between N1 and 0V (or VP), and a second reservoir capacitor 119 between N2 and 0V (or VP). In normal operation, at any given instant, either just one of the diodes 114, 116 is conducting, or neither of them are conducting. Denoting the voltage at N1 as VN1 and the voltage at N2 as VN2, the differential voltage at the load is (VN2−VN1). To make this voltage more positive (or equivalently, less negative), the bidirectional buck-boost converter 100 moves charge from N1 to N2. To make it more negative (or equivalently, less positive), the bidirectional buck-boost converter 100 moves charge from N2 to N1.

If the conversion were lossless and the load 90 were purely capacitive, the circuit could output a sine wave without ever needing any top-up charge from the power supply. Denoting the peak magnitude of the sine wave by VMAG, gives the following: At positive peaks, VN1≈VP and VN2 (VP+VMAG), so the load 90 and the second capacitor 119 hold most of the energy. At negative peaks, VN1 (VP+VMAG) and VN2≈VP, so the load 90 and first capacitor 118 hold most of the energy. At zero crossings there is no energy in the load. The energy is split equally between first and second capacitors 118, 119. At this time, the voltage VN1=VN2 on those capacitors is an intermediate value that can be calculated easily by invoking conservation of energy.

In practice the circuit is not lossless. With a sine wave, the circuit takes top-up charge from the power supply through first diode 114 at-and-near positive peaks, and through second diode 116 at-and-near negative peaks. Representative voltage waveforms of VN1 and VN2 over time are shown in the windows 111 112 in FIG. 11. The difference between these voltages is a desired sine wave at the load. The bidirectional buck-boost converter 100 drives the waveforms by moving energy from one side of the circuit to the other. The first and second capacitors 118 and 119 act as reciprocating energy reservoirs.

To achieve high efficiency in scenarios such as this, the energy transfers from the power supply to the circuit are not particularly critical. The transfers through the bidirectional buck-boost converter 100, i.e. between N1 and N2, are more significant. Energy makes the former journey no more than once, but for efficient operation it must make the latter journey many times.

Though the arrangement of FIG. 11 has been described with reference to capacitive loads, it is also usable with other types of load. This is described below.

In FIG. 12 the heart of the power stage 92 is again a bidirectional buck-boost converter 100. The power stage is like the one in FIG. 11, except that the two diodes have been replaced with two active switches 124, 126. Each of these is shown as a single FET, complete with body diode. Double-FET implementations to extend the voltage ranges at N1 and N2 further below VP are also possible. The first FET 124 is connected from VP to N1, and the second FET 126 is connected from VP to N2. Their orientation is such that the body diode does not conduct during normal operation.

A preferred way of operating these FETs is as follows. When the differential voltage at the load circuit (VN2 VN1) is at-least one diode-drop more positive than zero, FET 124 is held on. When it is at least one diode-drop more negative than zero, FET 126 is held on. When it is near or at zero, one of the FETs 124, 126 is held on, but which one may depend on signal history and dynamics. Implementing some hysteretic behaviour in this region can improve efficiency and waveform fidelity, especially at low signal levels.

Using FETs 124 and 126, one side and the other side of the load circuit can be alternately pinned to the power supply voltage VP. Representative voltage waveforms of VN1 and VN2 over time are shown in windows 121 and 122 of FIG. 12. The difference between these voltages is a desired sine wave at the load. These FETs can be switched relatively infrequently. Their switching rate is signal-related, and approaches zero at low signal levels. It is much lower than the switching rate of the switches within the bidirectional buck-boost converter 100. This very-much eases the compromise between low on-resistance, low capacitance and low price, for these two FETs.

The arrangement of FIG. 12 allows reactive power to flow back to the power supply. With AC signals and partly or wholly reactive load circuits, the power supply acts in-part as a reciprocating energy reservoir. The reciprocating energy and/or the associated supply-voltage pumping need to be accommodated.

With the arrangement of FIG. 12, too much capacitance between N1 and 0V (or VP) or between N2 and 0V (or VP) can hinder successful switchover between FET 124 and FET 126. It is preferable to have capacitance between N1 and N2 instead. For driving two-terminal capacitive loads, the arrangement of FIG. 12 can generally manage with less additional capacitance than the arrangement of FIG. 11. This means the currents and charges can be lower, which reduces losses.

The arrangements of FIG. 11 and FIG. 12 share a common feature. Each of N1 and N2 is connected to VP from time to time. These connections are not permanent. They are dynamic, as required for successful operation of the circuit. Other arrangements for connecting to the power supply are possible and will be readily arrived at by people skilled in the art. Some of these arrangements share the above-mentioned feature. Others never connect N1 or N2 directly to VP, but all the same provide energy paths between the power supply and the rest of the circuit. For example, a simple power conversion block can be used to intermediate between VP and N1, and another such block can be used to intermediate between VP and N2. These blocks can be operated synchronously with the bidirectional buck-boost converter.

Figure 13:
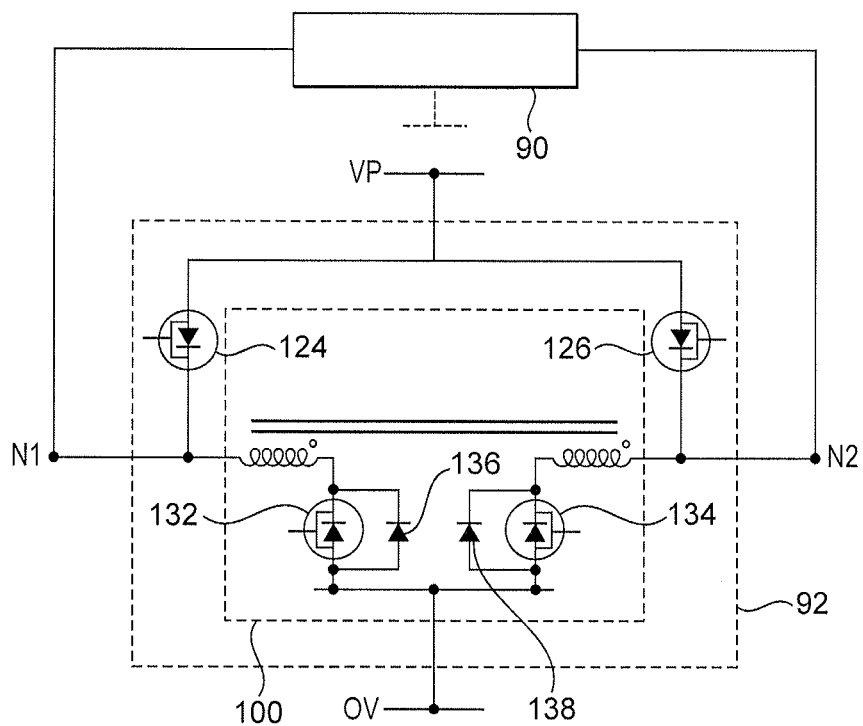
FIG. 13 shows a bidirectional flyback converter in the circuit of FIG. 12.
Figure 14:
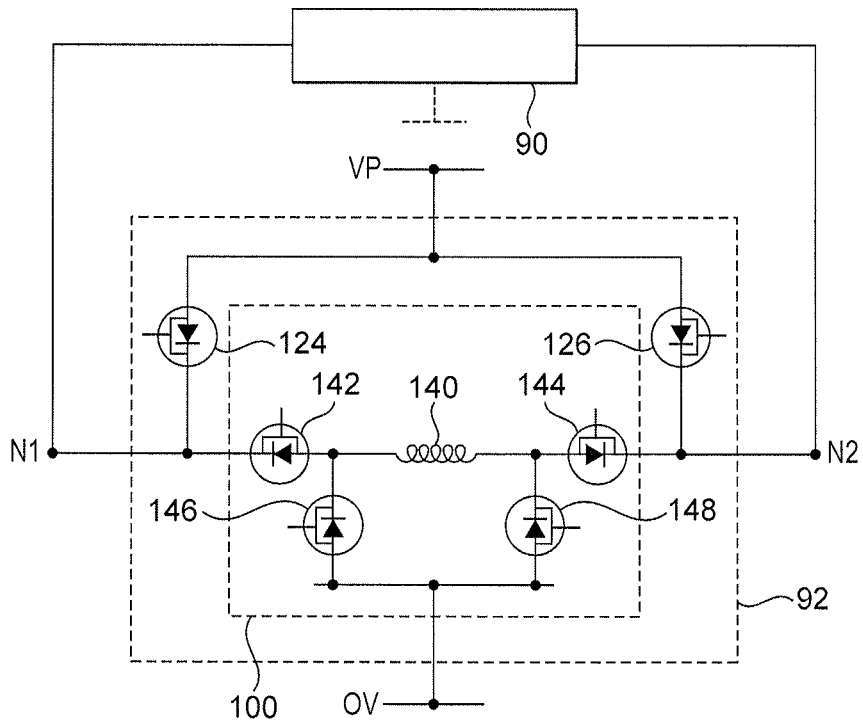
FIG. 14 shows a bidirectional four-switch converter in the circuit of FIG. 12.

Bidirectional buck-boost converters are well-known in the art. Many different types exist that could be used in the circuits of FIGS. 10 to 12. FIG. 13 and FIG. 14 show two preferred types, applied to the exemplary arrangement of FIG. 12.

The circuit of FIG. 13 is a first preferred embodiment of the present invention. In it, the bidirectional buck-boost converter 100 is a basic bidirectional flyback converter. The implementation and operation of bidirectional flyback converters has been detailed in many publications. This includes for example a 1989 paper on the 'Current mode controlled bidirectional flyback converter' by Venkatesan (IEEE PESO convention proceedings). Further guidance can be found in U.S. Pat. No. 5,745,351.

In its most-basic form, the bidirectional flyback converter is composed of a coupled inductor 130, 131 and just two active switches 132, 134. This is a relatively small number of active switches, which keeps losses down. In FIG. 13 the active switches 132, 134 are single FETs. They are ground referred, which makes them easy to drive.

In FIG. 13 Schottky diodes 136 and 138 are shown connected across the FETs 132 and 134 respectively. As is well-known in the art, fitting these can be appropriate for any switching circuit that is not always operated in continuous conduction mode (CCM) with synchronous rectification. They perform better than the FETs' body diodes, which raises the obtainable efficiencies. Schottky diodes are not shown in FIG. 14 or any of the subsequent figures, partly because they are not always necessary, but mostly to improve the clarity of the figures. However, they may be used wherever a FET is shown.

For applications such as the amplification of signals with high peak-to-average power ratios, the best overall efficiency is obtained by operating the circuit in DCM. Additionally, operating in DCM avoids the dead-time distortion mechanism that affects all conventional class-D amplifiers.

Operation of the circuit shown in FIG. 13 in DCM, again using the case that the load circuit is a simple two-terminal capacitive load, will now be described. Initially FET 124 is on, FET 126 is off, the output voltage (VN2−VN1) is positive, and it is desired to make it more positive. First FET 132 is switched on. The current in FET 132 builds up as the inductor 130, 131 is energised by the power supply, through node N1. At an appropriate instant, FET 132 is switched off. The current moves across to diode 138, and the energy starts to move from the inductor 131 out to the load 90, through node N2. The current winds down to zero, and then stays at zero until the next cycle. The net result is a transfer of energy from the power supply to the load.

To move the energy from the load 90 back to the power supply FET 134 is first switched on. The current in FET 134 builds up as the inductor is energised by the load, through node N2. At an appropriate instant FET 134 is switched off. The current moves across to diode 136, and the energy starts to move from the inductor 130 out to the power supply, through node N1. The current winds down to zero, and then stays at zero until the next cycle.

It is easy to derive the corresponding sequences for when FET 124 is off and FET 126 is on. To make the output voltage (VN2−VN1) more positive (or equivalently, less negative), we switch FET 132 on then off. To make the output voltage (VN2−VN1) more negative (or equivalently, less positive), we switch FET 134 on then off.

FIG. 14 shows a second preferred embodiment of the present invention. In the circuit of FIG. 14 the bidirectional buck-boost converter 100 is an archetypal bidirectional four-switch converter. The four-switch converter has been referred to by a number of different names over the years. In Erickson & Maksimovic it is called the non-inverting buck-boost converter. (See for example FIG. 6.14 in that book.) The implementation and operation of bidirectional four-switch converters has been detailed in many publications. This includes for example a 1995 paper on '20 kW water-cooled prototype of a buck-boost bidirectional DC-DC converter topology for electrical vehicle motor drives' by Caricchi, Crescimbini and Napoli (IEEE APEC conference proceedings). Further teaching can be found in U.S. Pat. No. 5,734,258.

The wound component in the bidirectional four-switch converter is a simple two-terminal inductor 140. This is an advantage over the bidirectional flyback converter. The number of active switches in the bidirectional four-switch converter is four. This is a disadvantage over the bidirectional flyback converter. In FIG. 14 the active switches are shown as single FETs, 142, 144, 146, 148. There will typically also be four corresponding Schottky diodes (not shown).

For applications such as the amplification of signals with high peak-to-average power ratios, the best overall efficiency is obtained by operating the circuit in DCM. Additionally, operating in DCM avoids the dead-time distortion mechanism that affects all conventional class-D amplifiers.

One way of operating the bidirectional four-switch converter of FIG. 14 in DCM is as follows. To make the output voltage (VN2−VN1) more positive (or equivalently, less negative), FET 142 and FET 148 are switched on then off. While they are on, the current in them builds up as the inductor 140 is energised. When they are switched off, the current moves to the body diodes of FET 146 and FET 144, or to their associated Schottky diodes (not shown). It winds down to zero, and then stays at zero until the next cycle. To make the output voltage (VN2−VN1) more negative (or equivalently, less positive), FET 144 and FET 146 are switched on then off. While they are on, the current in them builds up as the inductor 140 is energised. When they are switched off, the current moves to the body diodes of FET 148 and FET 142, or to their associated Schottky diodes (not shown). It winds down to zero, and then stays at zero until the next cycle.

Figure 20:
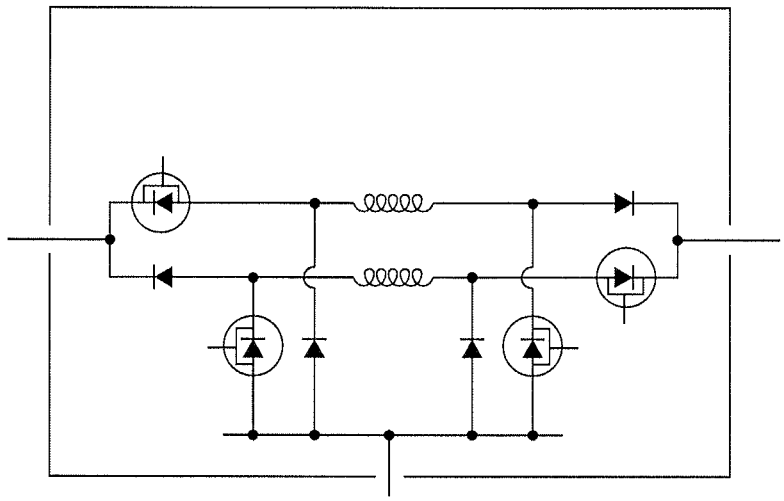
FIG. 20 shows an alternative converter that can be used in the circuit of FIG. 9.

This switch sequence provides the function of two uni-directional boost converters who share a single inductor. The two boost converters are cross coupled in that the input of one converter is connected to the output of the other converter. Bi-directional conversion, of FIG. 9, is therefore achieved through the implementation of two uni-directional converters connected in opposing direction. FIG. 20 illustrates a similar configuration though not sharing a common inductor. In all cases, when the voltage of either VN1 or VN2 falls below the battery voltage, Vp, the diode/switch 124 or 126 conducts to replenish lost charge.

Other ways of operating the bidirectional four-switch buck-boost converter in FIG. 14 are possible. Some of them give greater efficiency, in part by lowering the aggregate FET switching rate. Details can be found for example in a 2009 paper on 'Three-mode dual-frequency two-edge modulation scheme for four-switch buck-boost converter' by Ren, Ruan, Qian, Li and Chen (IEEE Transactions on Power Electronics). Further teaching can be found in U.S. Pat. No. 6,636,431.

Figure 15:
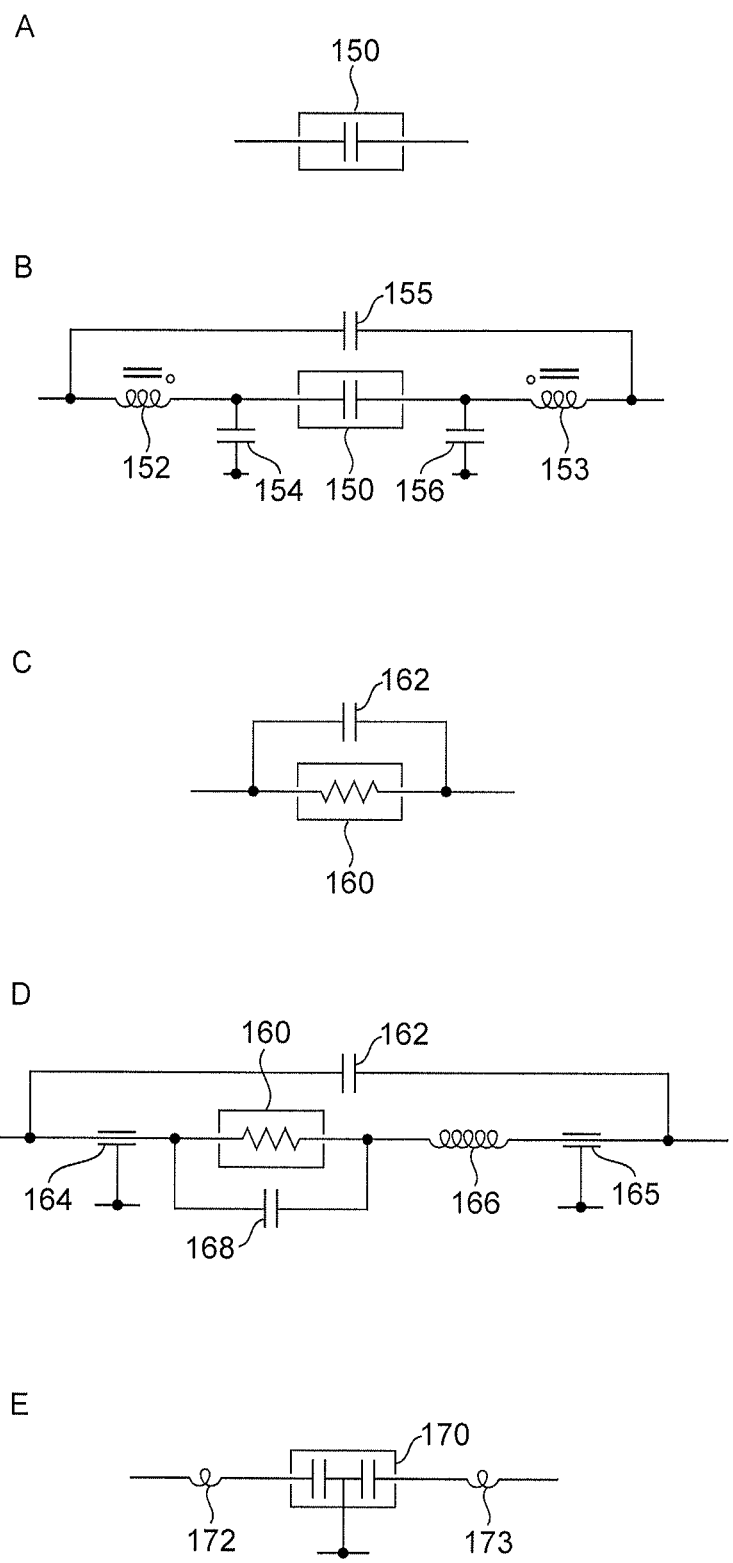
FIG. 15 shows some example load circuits.

The load circuits 90 in FIGS. 9 to 14 may include connections to 0V, or to other circuit nodes. They typically include an output filter and either a load or terminals to connect a load. The output filter is typically comprised of a small number of passive components. FIG. 15 illustrates some examples.

FIG. 15A shows the case of no output filter and a two-terminal capacitive load 150 (e.g. a piezoelectric actuator or an electroactive polymer actuator). FIG. 15B adds a VHF filter to reduce radio-frequency emissions. The filter comprises a common-mode choke 152, 153 and ceramic capacitors 154, 155 and 156, arranged in such a way that they do not affect the switching and baseband performance of the amplifier or power converter. FIG. 15C shows a resistive load 160 with a shunt capacitor 162 for smoothing. The shunt capacitor 162 makes the load circuit look capacitive at the switching frequency. This gives good results with the power stages of FIG. 13 and FIG. 14. It differs from the output filtering approach that one would use with voltage-output CCM power stages. It is synergistic with current-output DCM power stages. FIG. 15D shows a hybrid approach. In addition to the shunt capacitor 162 and the two 3-terminal capacitors 164, 165 for VHF suppression, there is a second-order output filter comprising the load 160 plus inductor 166 and capacitor 168. Finally, FIG. 15E shows a three-terminal capacitive load 170 with its common terminal connected to 0V. Four-terminal loads are also possible, and can be accommodated for-example by commoning two of their terminals, so that they become three-terminal loads. The load circuit of FIG. 15E also comprises two ferrite beads 172, 173, for radio frequency suppression.

With a three-terminal capacitive load as in FIG. 15E, the arrangement of FIG. 11 would not need reservoir capacitors 118 and 119. The job of capacitors 118 and 119 would be done by the two halves of the load.

Figure 16:
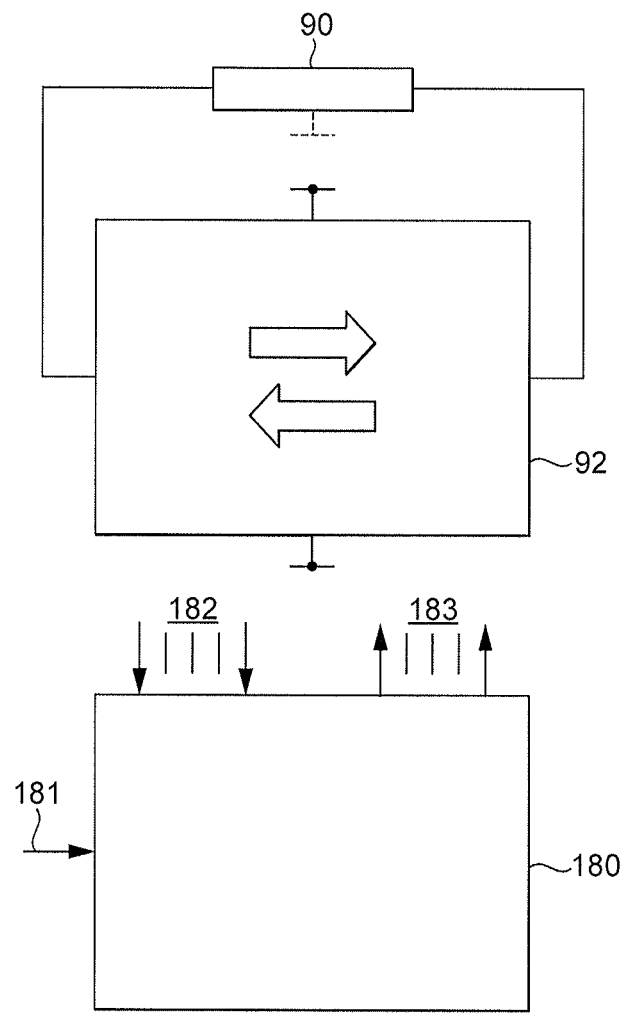
FIG. 16 illustrates an input signal and control block of an amplifier in accordance with the invention.

FIG. 16 shows the load circuit 90 and power stage 92 of FIGS. 9 to 14, but it additionally shows the amplifier or power converter's control block 180, in general form. This block receives an input signal 181 which in some prescribed way defines a desired signal at the load. It generally also receives status signals and value information 182 from the power stage 92 and the load circuit 90. And it provides control signals 183 to drive the power stage's active switches. The control block implements a control scheme. Many control schemes are known in the art. A preferred control scheme for the circuits of FIG. 13 and FIG. 14, when driving a resistive load with dominant shunt capacitance as in FIG. 15C for example, is the energy-centric control scheme of Janocha and Stiebel. This is detailed in their 1998 paper titled 'New approach to a switching amplifier for piezoelectric actuators' (ACTUATOR 98 conference proceedings, ISBN 978-3-933339-00-1). In each switching cycle their scheme transfers "exactly that portion of energy which is necessary to achieve the desired output value at the load". Further guidance can be found in a 2013 paper titled 'CogniPower predictive energy balancing for switched-mode power amplifiers', by Lawson (file 'APEC2013_PEB_Audio_Amp.pdf' from http://cognipower.com/pdf).

The control circuit of a power conversion block with a common terminal (0V) is generally configured to control a parameter associated with an aggregate power sink that is connected between another of that block's terminals and the common terminal. In the context of FIG. 9 or FIG. 10 for example, the controlled parameter would typically be the voltage at N2. For the present invention a different configuration is needed, because the load 90 is connected across the power stage 92. The control circuit must be configured to establish the desired signal at the load circuit or at the load. As an example, it may be configured to control the differential voltage at the load circuit (VN2−VN1). More generally, the controlled parameter could be voltage, current, integrated voltage, charge, some other important measure, or some combination of these things.

Figure 17:
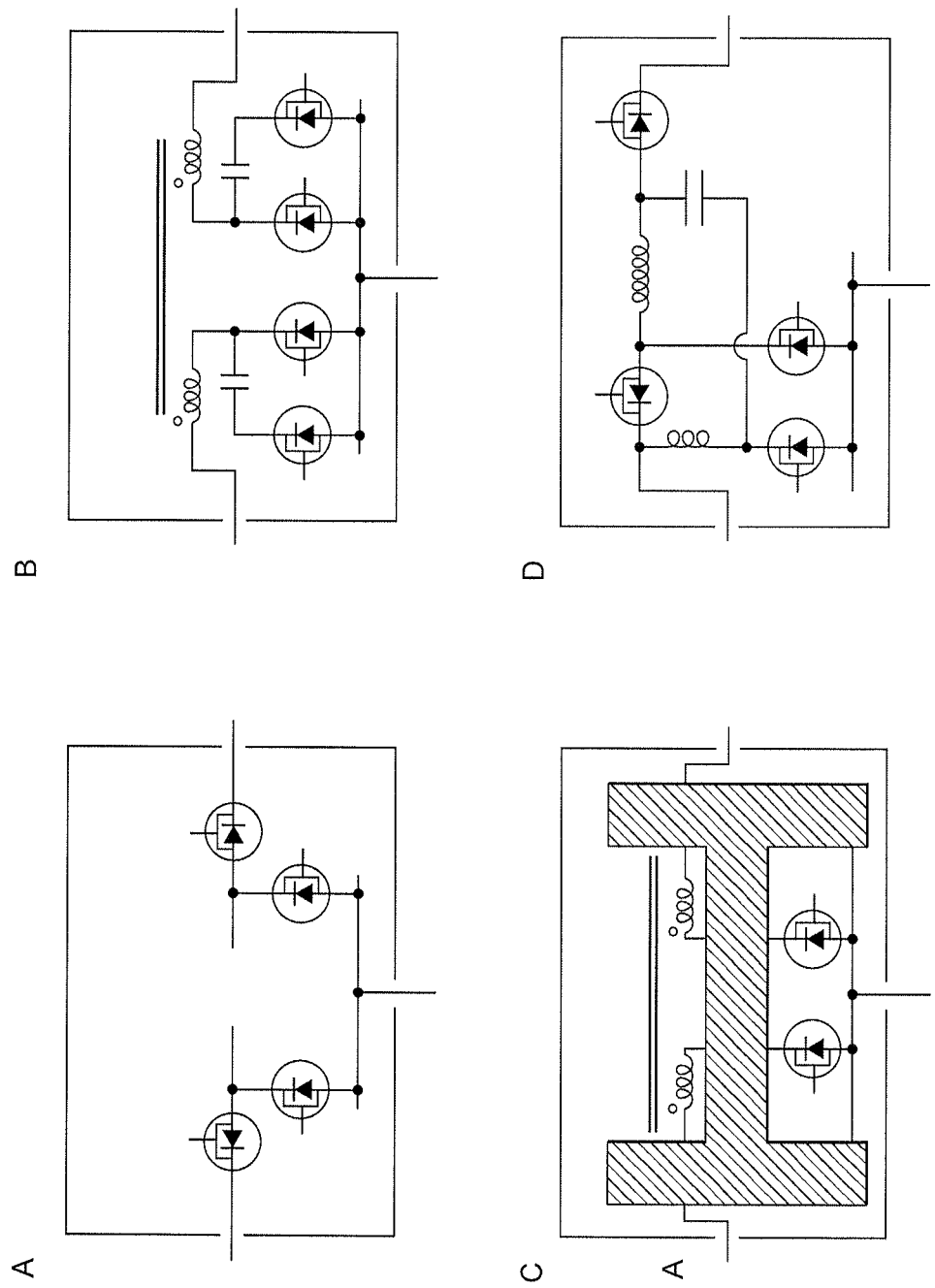
FIG. 17 shows a selection of bidirectional buck-boost converters.

There are many different types of bidirectional buck-boost converter that can be used as block 100 in FIG. 10. Eight of them are shown in FIG. 17. The first example, shown in FIG. 17A, is the bidirectional four-switch buck-boost converter, which has already been described with reference to FIG. 14.

Figure 1:
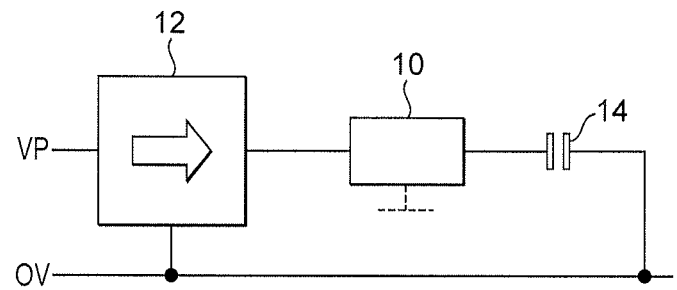
FIG. 1 depicts a prior-art single-ended amplifier or power converter with DC blocking.
Figure 2:
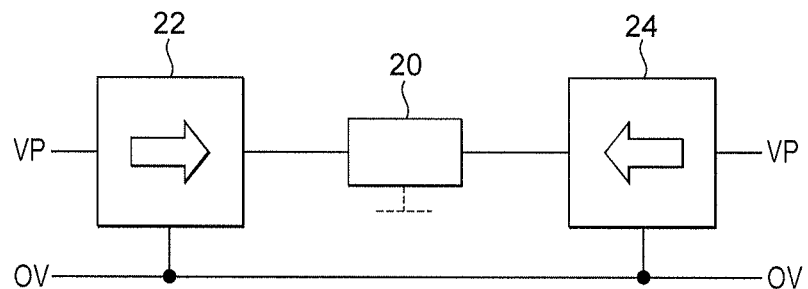
FIG. 2 depicts a prior-art bridged amplifier or power converter.
Figure 3:
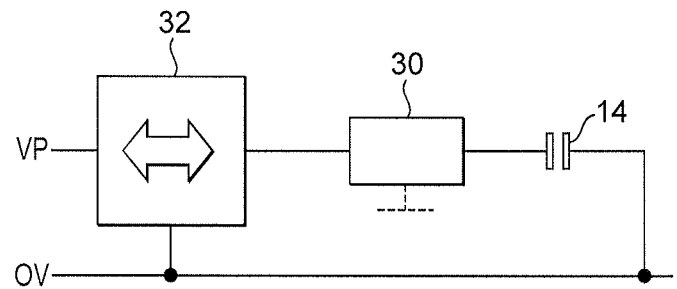
FIG. 3 depicts a bidirectional prior-art single-ended amplifier or power converter.
Figure 4:
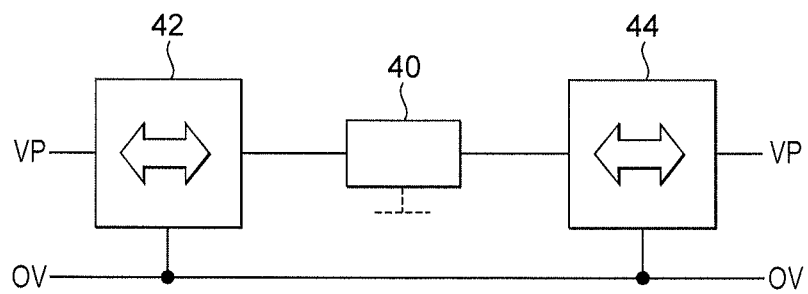
FIG. 4 depicts a bidirectional prior-art bridged amplifier or power converter.
Figure 5:
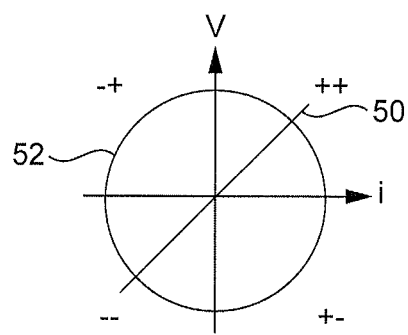
FIG. 5 shows the four quadrants of amplifier operation, plus two load lines.

FIG. 17B shows a bidirectional flyback converter with P-type active clamps. It is from a 2010 paper titled 'A high efficiency flyback converter with new active clamp technique' by Zhang, Huang, Wu and Qian (IEEE Transactions on Power Electronics). FIG. 17C is a generalized representation of bidirectional flyback converters. The shaded area covers a plurality of different possibilities. It encompasses FIG. 17B and many other flyback variants, including for-example the ones that are described in a 2006 paper on 'Experimental analysis of a flyback converter with excellent efficiency' by Boeke, Itzenga, Rigbers and De Doncker (IEEE APEC conference proceedings). FIG. 17D shows a bidirectional low-stress buck-boost converter. It is from a 2001 paper on Buck-boost PWM converters having two independently controlled switches' by Chen, Maksimovic and Erickson (IEEE PESO conference proceedings). It can be derived by the well-known step of replacing the diodes of a unidirectional converter with active switches, or alternatively by combining FIGS. 9 and 10 of that paper. FIG. 17E shows the bidirectional noninverting Cuk converter. It can be found for-example in FIG. 22a of chapter 9 of the Carbone book (ISBN 978 953 307 269 2). FIG. 17F shows the split-pi converter, which was disclosed in GB2376357. FIG. 17G shows an advantageous bidirectional four-winding converter from FIG. 4 of chapter 8 of the Carbone book. And FIG. 17H shows the bidirectional SEPIC or ZETA converter, which can be found for-example in FIG. 6.15 of Erickson & Maksimovic.

None of the converters in FIG. 17 have more than four active switches, and none of those switches need to withstand bipolar voltages. So it is clear that amplifiers and power converters according to the present invention can be designed so that they do not suffer from a proliferation of power transistors.

Many but not all of the possible power converter circuits are left-right symmetric. In all of the converters in FIG. 17, including the asymmetric ones, transferring energy from N1 to N2 involves one polarity of current in the wound component, and transferring energy from N2 to N1 involves the other polarity of current in the wound component.

Figure 18:
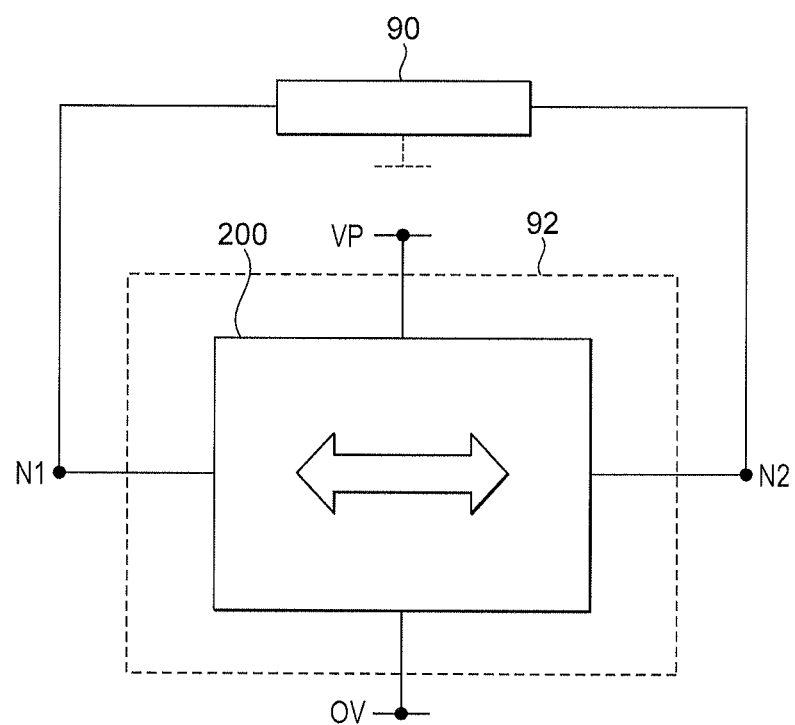
FIG. 18 shows the circuit of FIG. 10 comprising a three-port converter.

Each of the bidirectional buck-boost converters in FIG. 17 has one common terminal (0V) and just two other terminals. Such circuits are commonly referred to as two-port converters. FIG. 18 shows an amplifier or power converter according to the present invention, in which the power stage comprises a three-port converter 200. The three-port converter is connected to 0V, N1 and N2 as before, but it is also connected to VP. The three-port converter 200 has got all of the functionality of the bidirectional buck-boost converters described in relation to FIGS. 10 to 12. Additionally, it can transfer energy between VP and N1, and between VP and N2.

Figure 19:
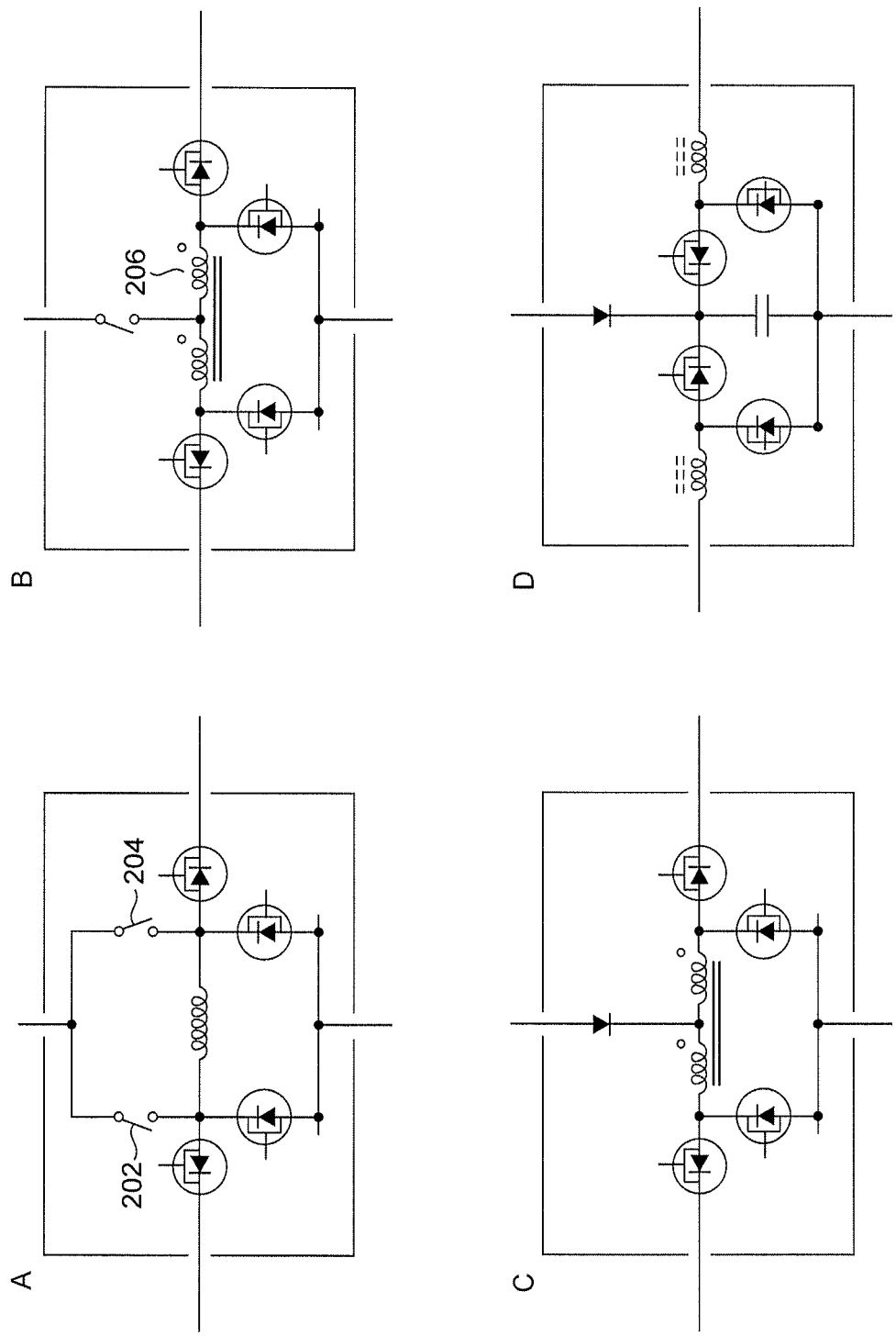
FIG. 19 shows a selection of three-port converters that may be used in the circuit of FIG. 18.

Many designs of such three-port converters are possible. FIG. 19 shows four examples. Each of them has a relationship to an associated two-port topology. For example, FIG. 19A is similar to FIG. 17A. FIG. 19A additionally includes two abstracted switches 202, 204. By appropriately controlling these switches and the FETs, the control block can transfer energy from and to VP. The circuit of FIG. 19B achieves the same result using fewer switches, but it requires a more complex wound component 200. In FIG. 19C and FIG. 19D the path from VP is unidirectional and self-regulating. There are similarities to the arrangement of FIG. 11. The converters of FIGS. 19A to 19D demand the presence of reservoir capacitors like those shown in FIG. 11. Another possibility is to add further windings to the wound components in FIG. 17, and to use those as a path from or back to the power supply.

FIG. 20 shows another circuit that can be used in the present invention. Unlike the circuits in FIG. 17, it is not intrinsically a bidirectional buck-boost converter. It is an interleave of two unidirectional buck-boost circuits. The FETs and diodes connected to the upper coil can transfer energy from the left to the right. The FETs and diodes connected to the lower coil can transfer energy from the right to the left. Though the coils are shown as separate, they can be wound on a common core. Using this block in place of the bidirectional buck-boost converter 100 of FIG. 11 or FIG. 12 delivers an amplifier or power converter that falls within the scope of the present invention, and that is well-represented by the general depiction of FIG. 9.

Figure 21:
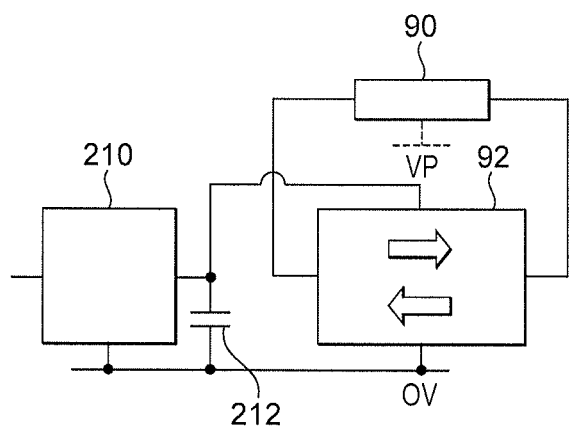
FIG. 21 illustrates an optional power adaption block and power reservoir.

FIG. 21 illustrates the fact that an amplifier or power converter according to the present invention may also include a power adaption block 210, feeding a power reservoir. In FIG. 21 the power reservoir is shown as a capacitor 212 between VP and 0V. In products that are battery powered, the adaption block 210 may be a DC-DC converter that draws energy from the battery at a smoothed rate. This can sidestep the power bottleneck that exists at many battery outputs. The DC-DC converter may perform some voltage boosting, so that the currents between the power reservoir 212 and the power stage 92 are not as high as they would otherwise be. This can ease component sizing. The amount of voltage boosting may be a function of prevailing conditions such as the amplifier's overall gain setting, or knowledge of the load, or knowledge of the prevailing signal level or of the evolving signal envelope. In products that are mains powered, the adaption block may be an AC-to-DC converter.

Though the figures show circuits using FETs, alternatives are of-course possible, including other types of transistor (BJT, IGBT, HEMT) and various types of thyristor (SCR, GTO, MCT). Transistor segmentation techniques may be used, e.g. to improve efficiency at low signal levels.

Boost amplifiers and power converters according to this invention may incorporate the ability to read signals back from the load. This may be used to determine information about the load, to monitor the state of the load, to manage equalization filtering, to improve frequency response flatness, or for other purposes.

Amplifiers and power converters as described with reference to the FIGS. 9 to 21 may be used in a wide range of devices. Examples include cars, desktop computers, notebook computers, tablet computers, mobile phones, loudspeaker subassemblies, actuation subassemblies, integrated positioners, medical implants, ultrasonic measurement equipment, RF transmitters, tactile feedback devices, smart panels, smart structures, and suchlike. Applications include audio amplification, actuation for tactile feedback in advanced user interfaces, ultrasonic amplification, RF amplification, other amplification, and power inversion.

The invention claimed is:

1. A switching amplifier comprising:
  a bidirectional power stage comprising a first terminal, a second terminal and a common terminal;
  wherein the bidirectional power stage is configured to operate with a load circuit connected between the first and second terminals,
  wherein the bidirectional power stage is configured to connect to a power supply providing a power supply voltage and wherein the first terminal is connected to a first node and the second terminal is connected to a second node, and
  wherein each of the first and the second nodes are alternately connected to and disconnected from the power supply voltage such that the first node draws electrical energy from the power supply via the first terminal at-and-near positive voltage peaks of a differential voltage between the second node and the first node, and the second node draws electrical energy from the power supply via the second terminal at-and-near negative voltage peaks of the differential voltage between the second node and the first node.

2. The switching amplifier of claim 1, wherein the bidirectional power stage is configured in one mode to move energy from the first terminal to the second terminal, and in another mode to move energy from the second terminal to the first terminal, and wherein the bidirectional power stage is a bidirectional buck-boost converter.

3. The switching amplifier of claim 1, wherein the switching amplifier provides voltage boosting and signal modulation in a single stage.

4. The switching amplifier of claim 1, wherein the bidirectional power stage comprises two unidirectional power converters arranged as a bidirectional power converter, and wherein the two unidirectional power converters are cross-coupled.

5. The switching amplifier of claim 1, further comprising a first diode or active switch connected from the power supply voltage to the first node and a second diode or active switch connected from the power supply voltage to the second node, the first and second diodes or active switches allowing for a flow of current from the power supply to the first node or the second node, depending on voltages at the first and second nodes.

6. The switching amplifier of claim 5, further comprising a first reservoir capacitor connected to the first node and a second reservoir capacitor connected to the second node.

7. The switching amplifier of claim 4, wherein the bidirectional power converter is a bidirectional flyback converter or a bidirectional four-switch converter or a three-port power converter comprising a third terminal, wherein the third terminal is connected to the power supply voltage.

8. The switching amplifier of claim 4, wherein the bidirectional power converter is configured for four-quadrant operation.

9. The switching amplifier of claim 4, wherein the bidirectional power converter is configured to provide voltage boosting to greater than twice a supply voltage.

10. The switching amplifier of claim 1, wherein the switching amplifier is provided fully or partially in an integrated circuit.

11. The switching amplifier of claim 4, further comprising a control circuit for the bidirectional power converter, wherein the control circuit is configured to control the bidirectional power converter based on a voltage across the load circuit or a current through the load circuit.

12. The switching amplifier of claim 11, wherein the bidirectional power converter comprises a plurality of active switches and wherein the control circuit is configured to control the active switches.

13. The switching amplifier of claim 4, wherein the bidirectional power converter comprises a single wound component.

14. The switching amplifier of claim 4, wherein the bidirectional power converter is a non-inverting converter.

15. The switching amplifier of claim 4, wherein the load circuit comprises a load.

16. The switching amplifier of claim 15, wherein the load circuit comprises at least one reactive component, and the switching amplifier is configured to operate the bidirectional power converter to take energy from the load circuit and to subsequently reapply that energy to the load circuit.

17. The switching amplifier of claim 15, wherein the load circuit comprises a predominantly resistive load and a capacitive output filter or a predominantly resistive load and a capacitive output filter or a predominantly resistive load and an inductive component.

18. The switching amplifier of claim 15, further comprising a power adaptation block and an associated power reservoir.

19. A method of operating a switching amplifier comprising a bidirectional power converter having a first terminal, a second terminal and a common terminal, the first terminal connecting to a first node and the second terminal connecting to a second node, the method comprising:
   connecting a load circuit between the first terminal and the second terminal and connecting the bidirectional power converter to a power supply providing a power supply voltage such that each of the first terminal and the second terminal can be alternately connected to and disconnected from the power supply voltage, such that the first node draws electrical energy from the power supply via the first terminal at-and-near positive voltage peaks of a differential voltage between the second node and the first node and the second node draws electrical energy from the power supply via the second terminal at-and-near negative voltage peaks of the differential voltage between the second node and the first node.

20. The method of operating the switching amplifier of claim 19, wherein the load circuit comprises a reactive component, and further comprising taking energy from the load circuit and subsequently reapplying that energy to the load circuit.

21. A switching amplifier comprising:
a bidirectional power stage comprising a first terminal, a second terminal and a common terminal,
   wherein the bidirectional power stage is configured to operate with a load circuit connected between the first and second terminals,
   wherein the bidirectional power stage comprises two unidirectional power converters arranged as a bidirectional power converter,
   wherein the two unidirectional power converters are cross-coupled,
   wherein the bidirectional power stage is configured to connect to a power supply providing a power supply voltage and wherein the first terminal is connected to a first node and the second terminal is connected to a second node, and
   wherein each of the first and the second nodes are alternately connected to and disconnected from the power supply voltage.

22. A switching amplifier comprising:
a bidirectional power stage comprising a first terminal, a second terminal and a common terminal,
   wherein the bidirectional power stage is configured to operate with a load circuit connected between the first and second terminals,
   wherein the bidirectional power stage is configured to connect to a power supply providing a power supply voltage and wherein the first terminal is connected to a first node and the second terminal is connected to a second node, and
   wherein each of the first and the second nodes are alternately connected to and disconnected from the power supply voltage;
a first diode or active switch connected from the power supply voltage to the first node, and a second diode or active switch connected from the power supply voltage to the second node, the first and second diodes or active switches allowing for a flow of current from the power supply to the first node or the second node, depending on voltages at the first and second nodes; and
a first reservoir capacitor connected to the first node and a second reservoir capacitor connected to the second node.

* * * * *